United States Patent [19]

Tang et al.

[11] Patent Number: 5,025,346

[45] Date of Patent: Jun. 18, 1991

[54] LATERALLY DRIVEN RESONANT MICROSTRUCTURES

[75] Inventors: William C. Tang, Emeryville; Roger T. Howe, Lafayette, both of Calif.

[73] Assignee: Regents of the University of California, Oakland, Calif.

[21] Appl. No.: 312,642

[22] Filed: Feb. 17, 1989

[51] Int. Cl.[5] .................. H01G 7/00; G01P 15/08
[52] U.S. Cl. .................. 361/283; 73/517 AV
[58] Field of Search ............. 361/283, 286, 296, 297, 361/298; 73/336.5, 517 AV, 704

[56] References Cited

U.S. PATENT DOCUMENTS 3,221,256 11/1965 Walden .................. 361/296 X
4,030,347 6/1977 Norris et al. .................. 361/283 X Primary Examiner—Donald A. Griffin
Attorney, Agent, or Firm—Owen, Wickersham & Erickson

[57] ABSTRACT

A microbridge device for use as a sensor or an actuator is driven parallel to a substrate as a resonant microstructure. The microstructure comprises a stationary thin-film electrode secured to the substrate and located in a plane above it. A movable plate overlaying the substrate is suspended above it. The movable plate and electrode are patterned to provide for each at least one comb with fingers interdigitated with those of the other.

20 Claims, 11 Drawing Sheets

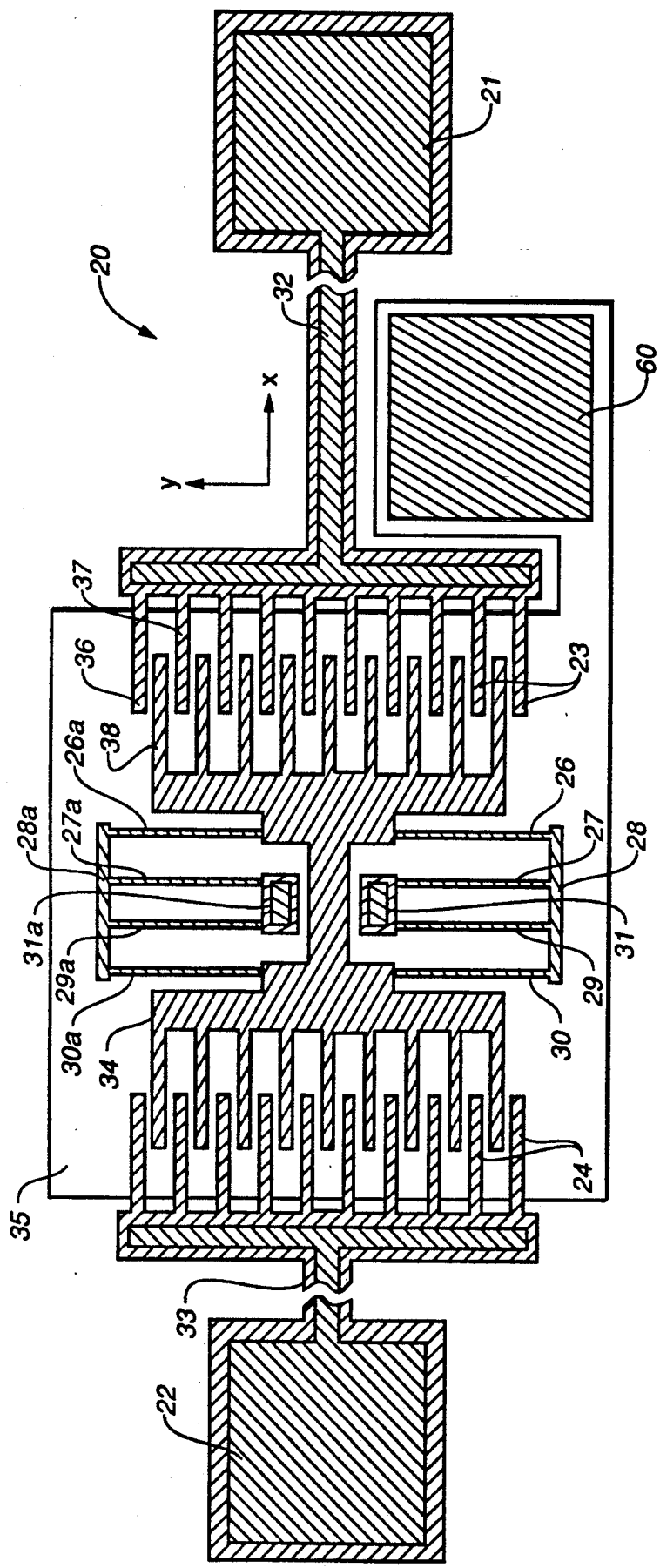
FIG._1

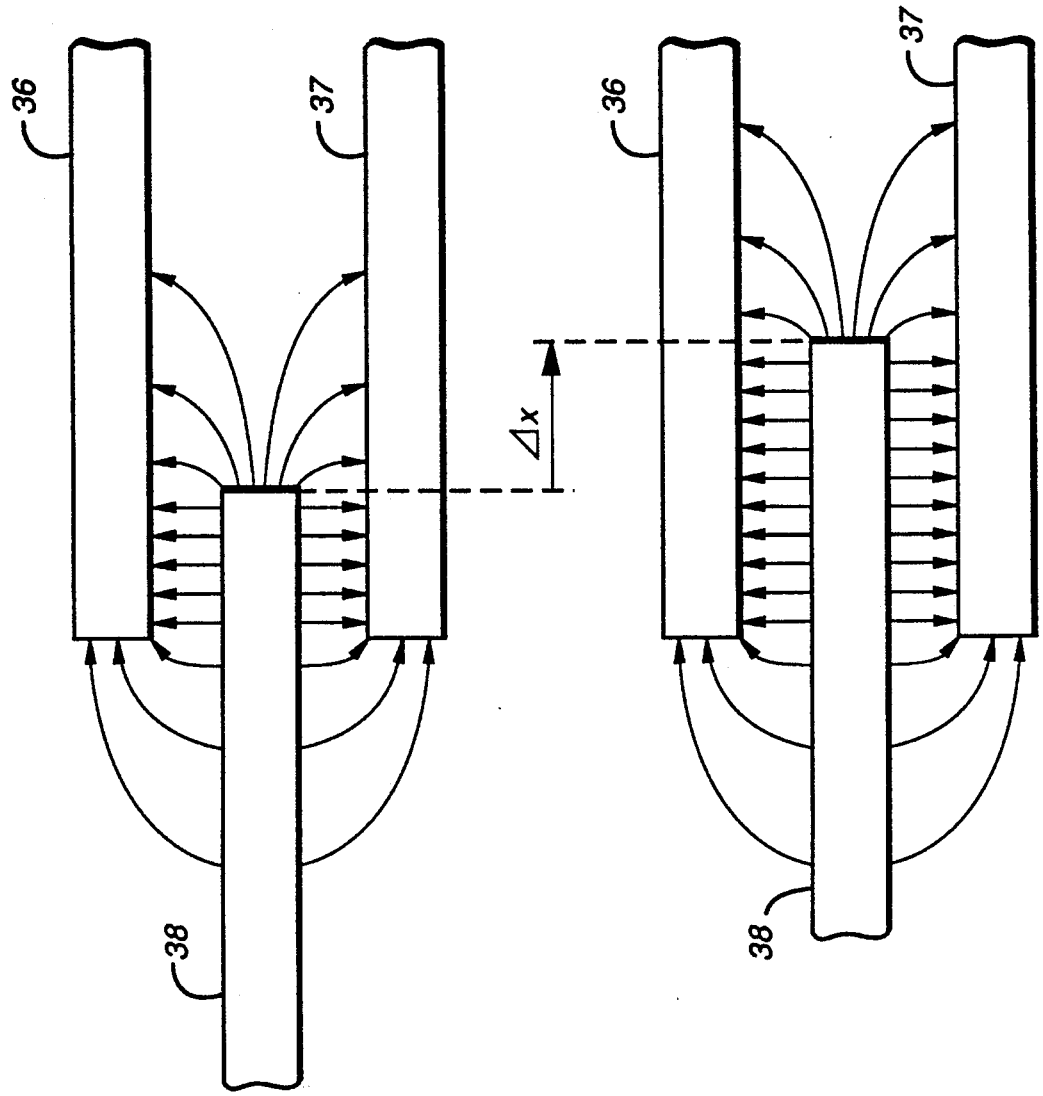
FIG._2
FIG._3

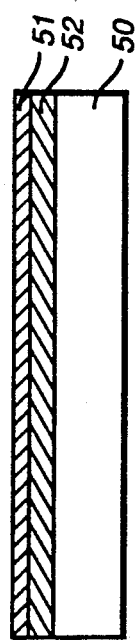
FIG._4A
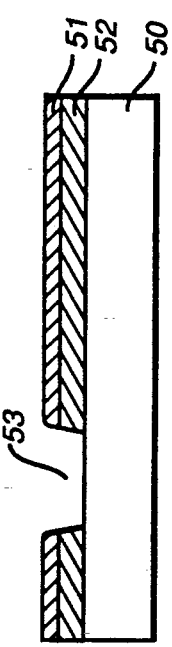
FIG._4B
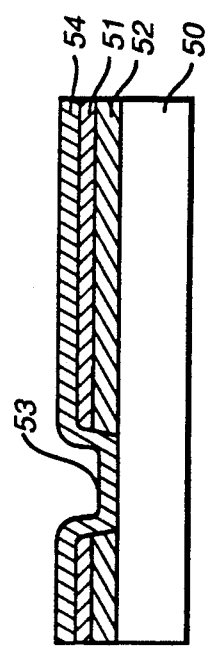
FIG._4C
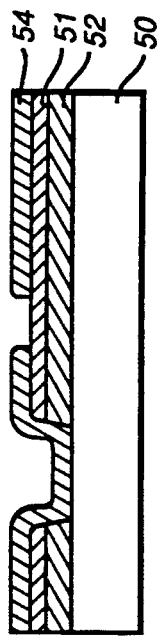
FIG._4D
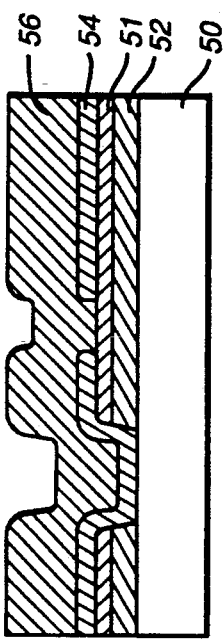
FIG._4E
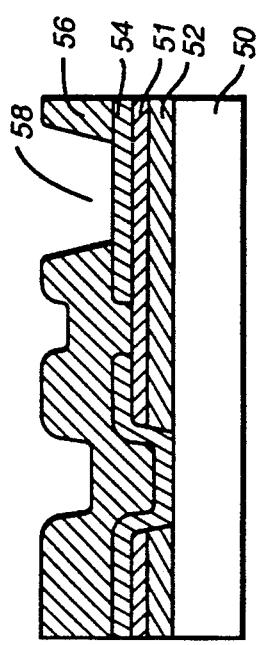
FIG._4F

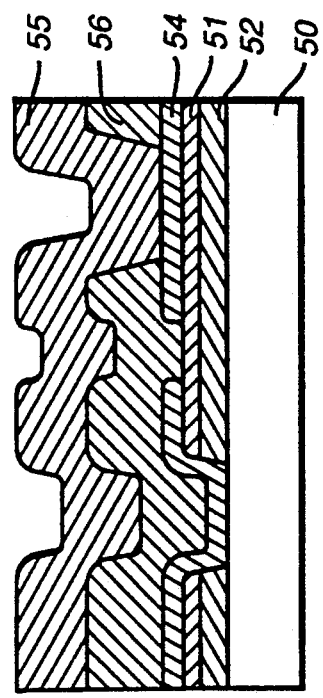
FIG._4G
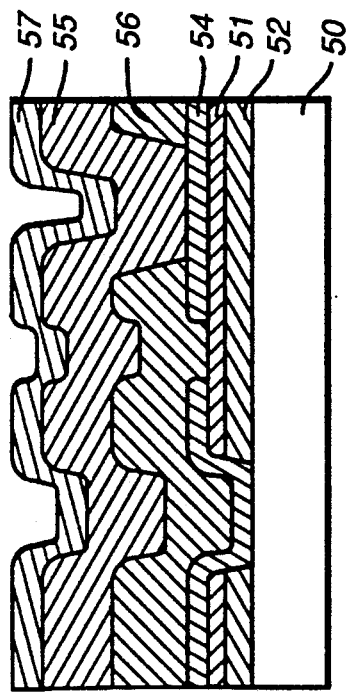
FIG._4H
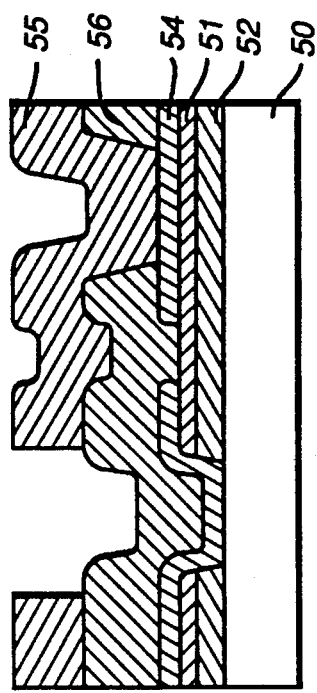
FIG._4I
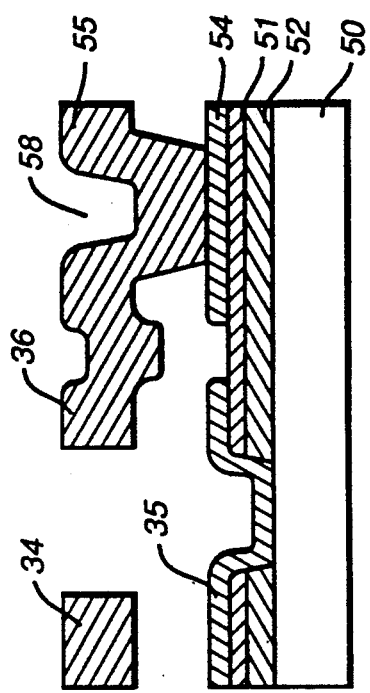
FIG._4J

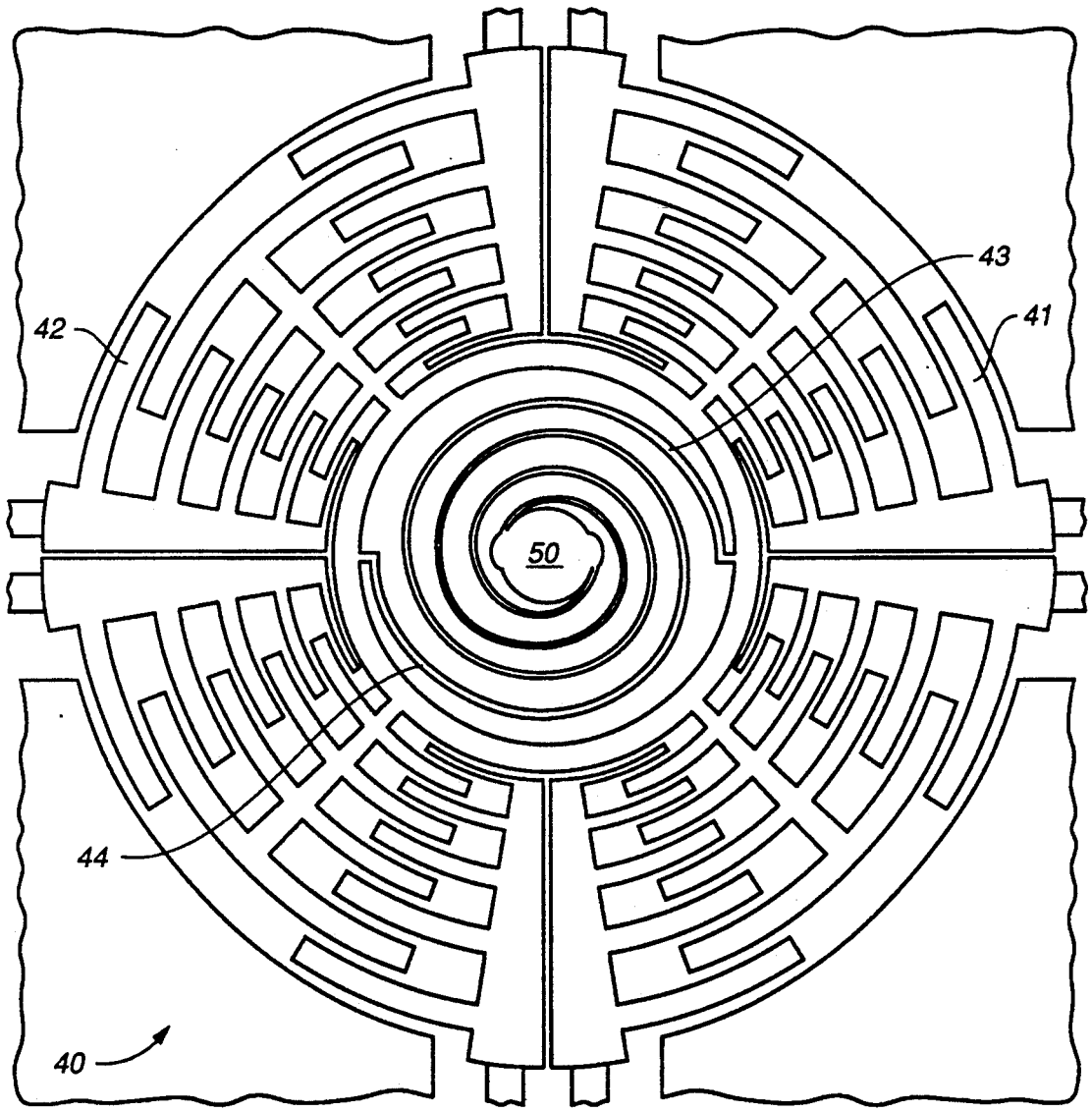
FIG._5

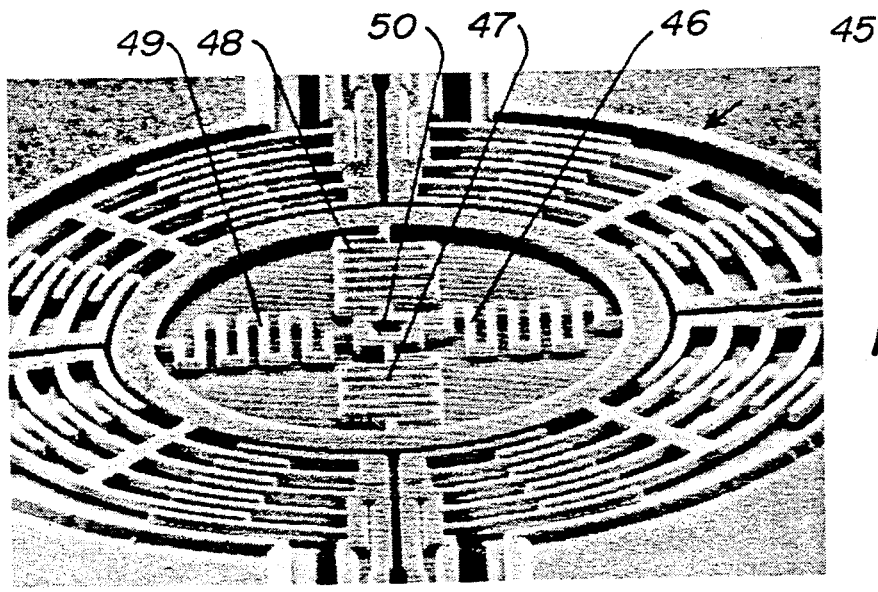
FIG._6
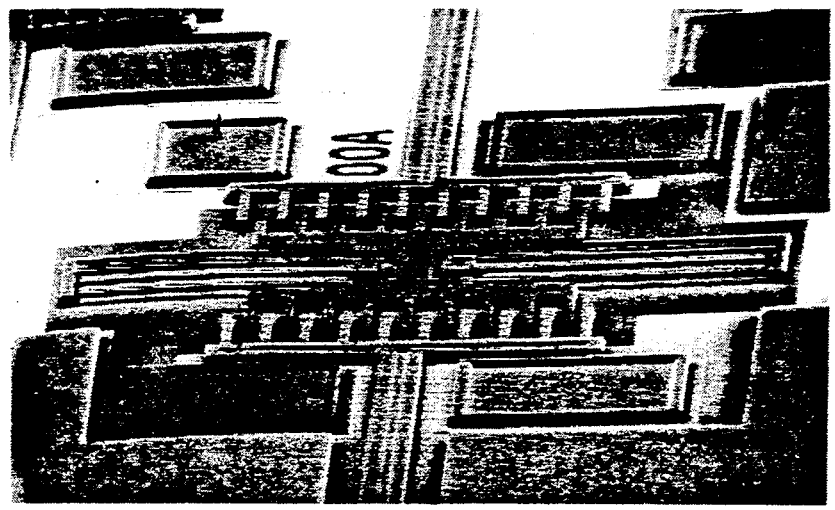
FIG._7
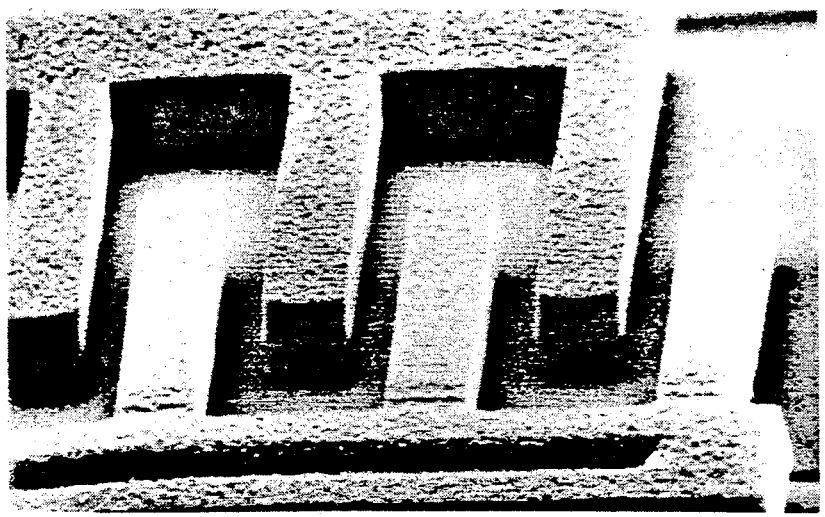
FIG._8

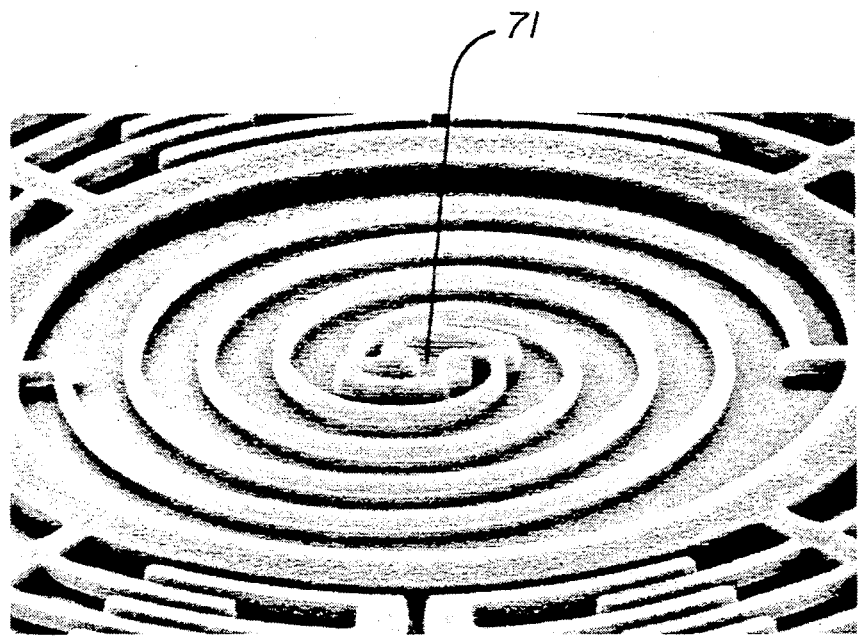
FIG._9
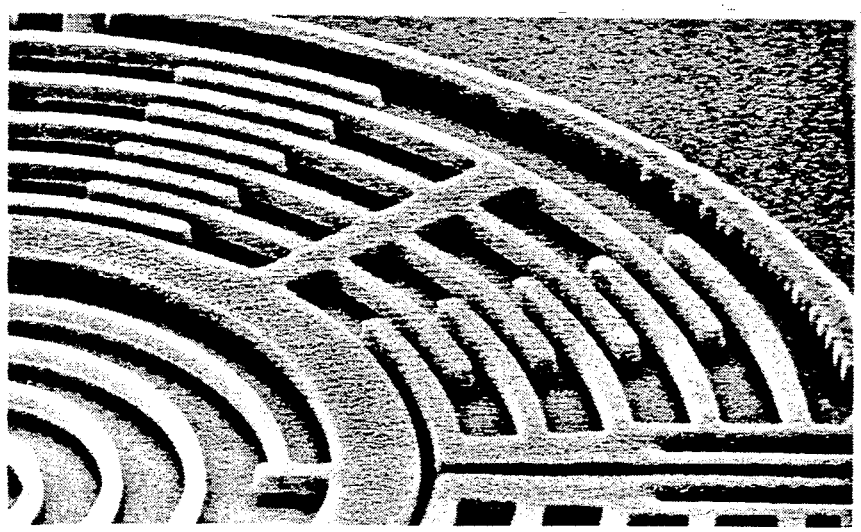
FIG._10

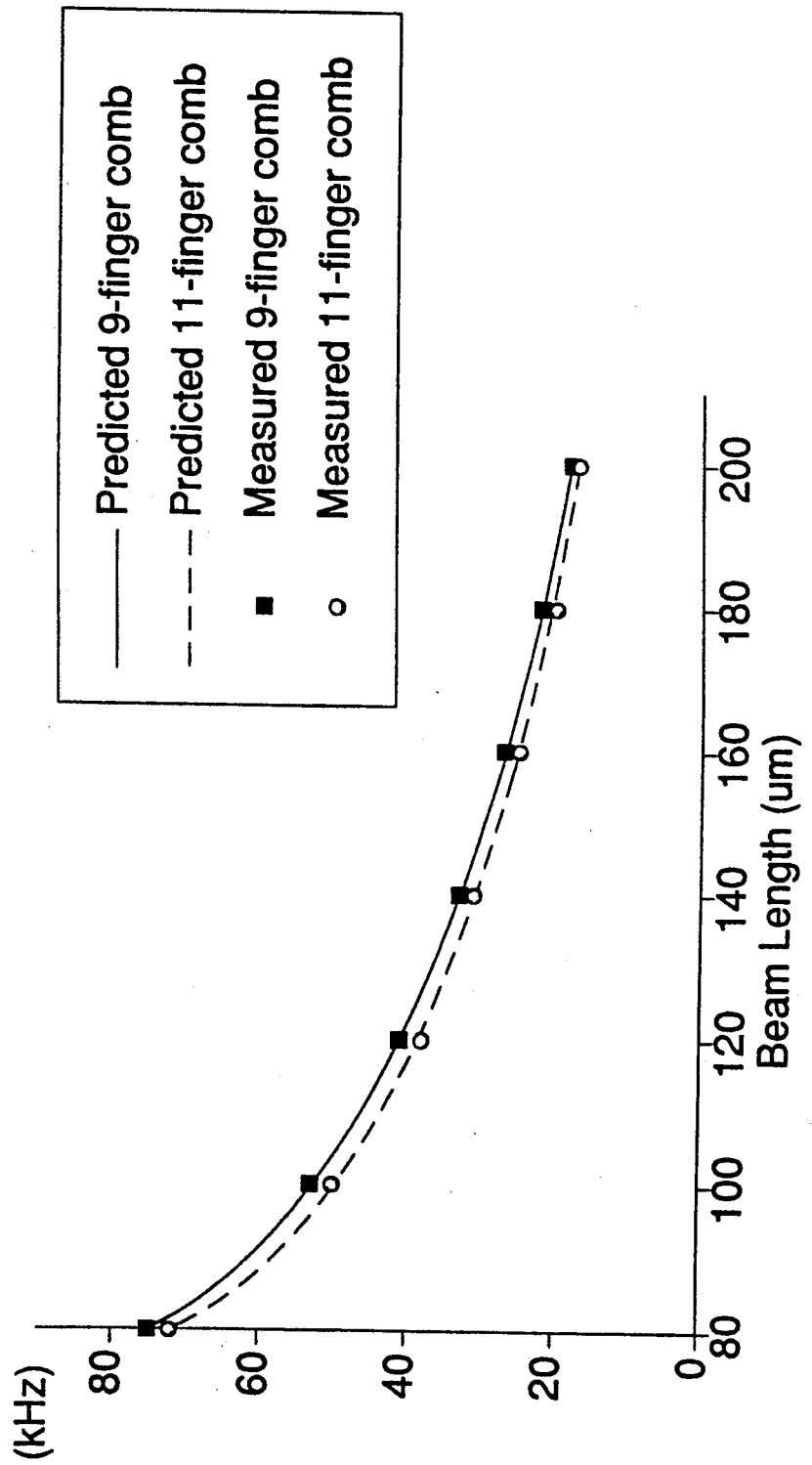
FIG._11

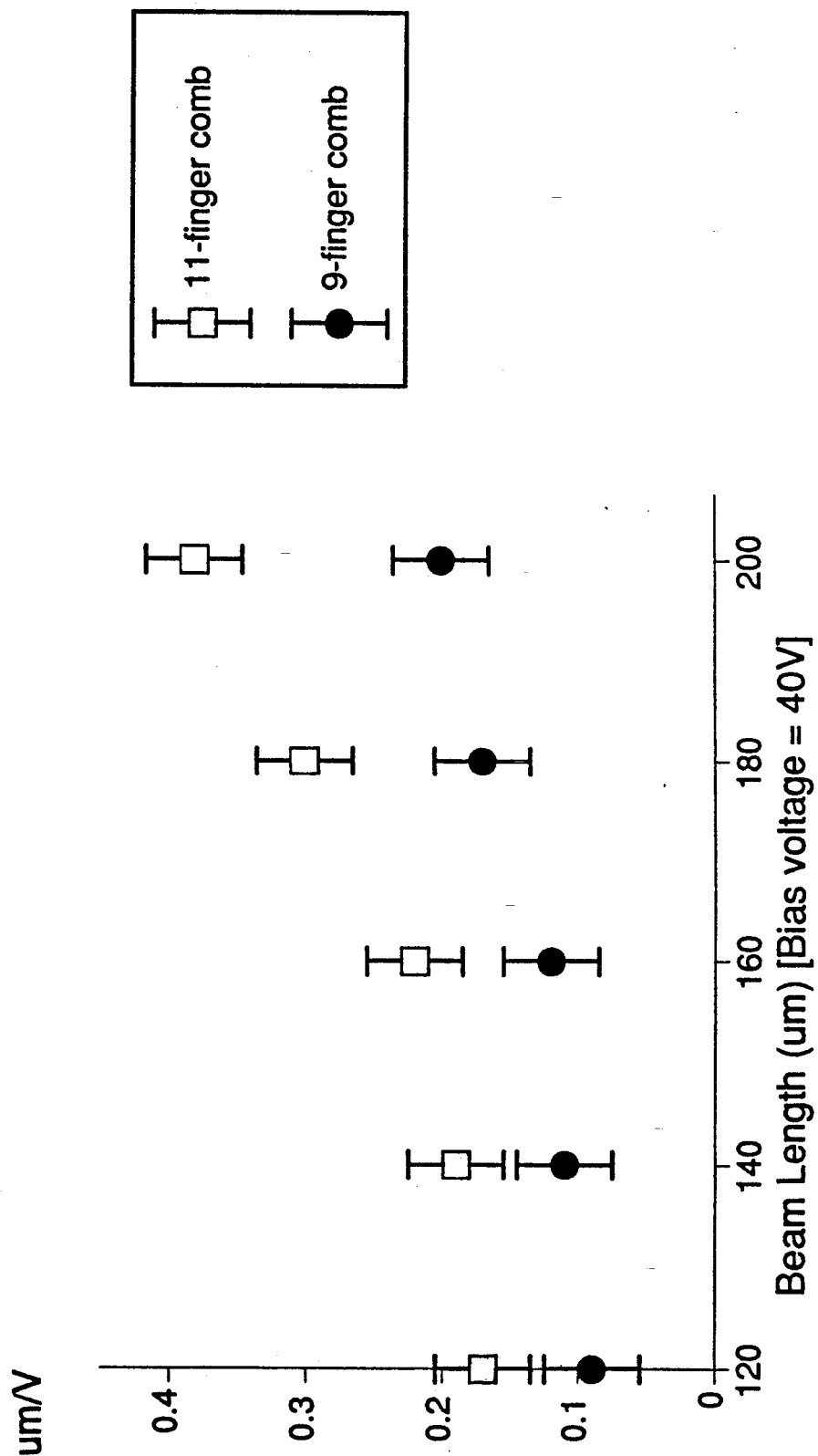
FIG._12

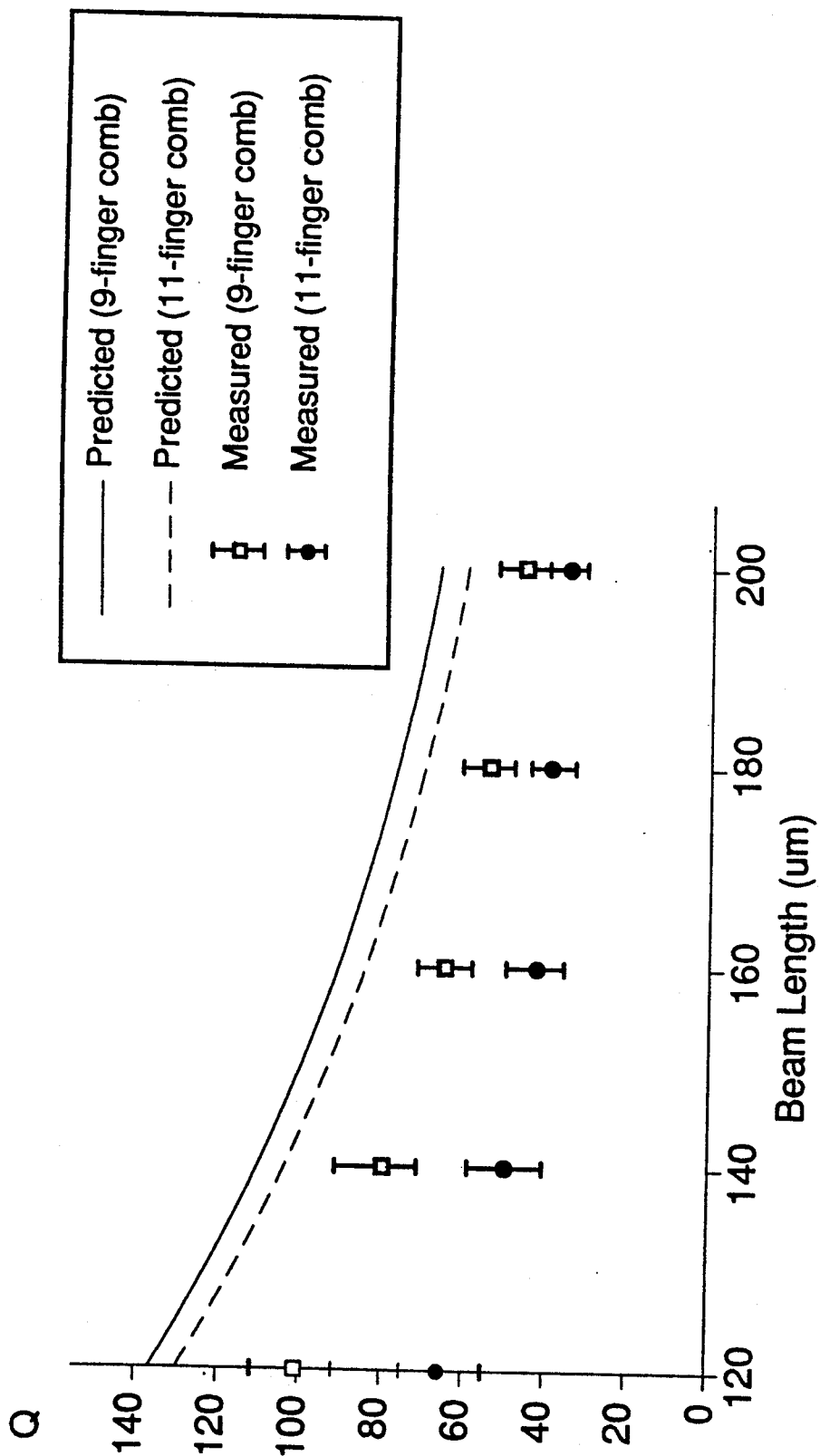
FIG._13

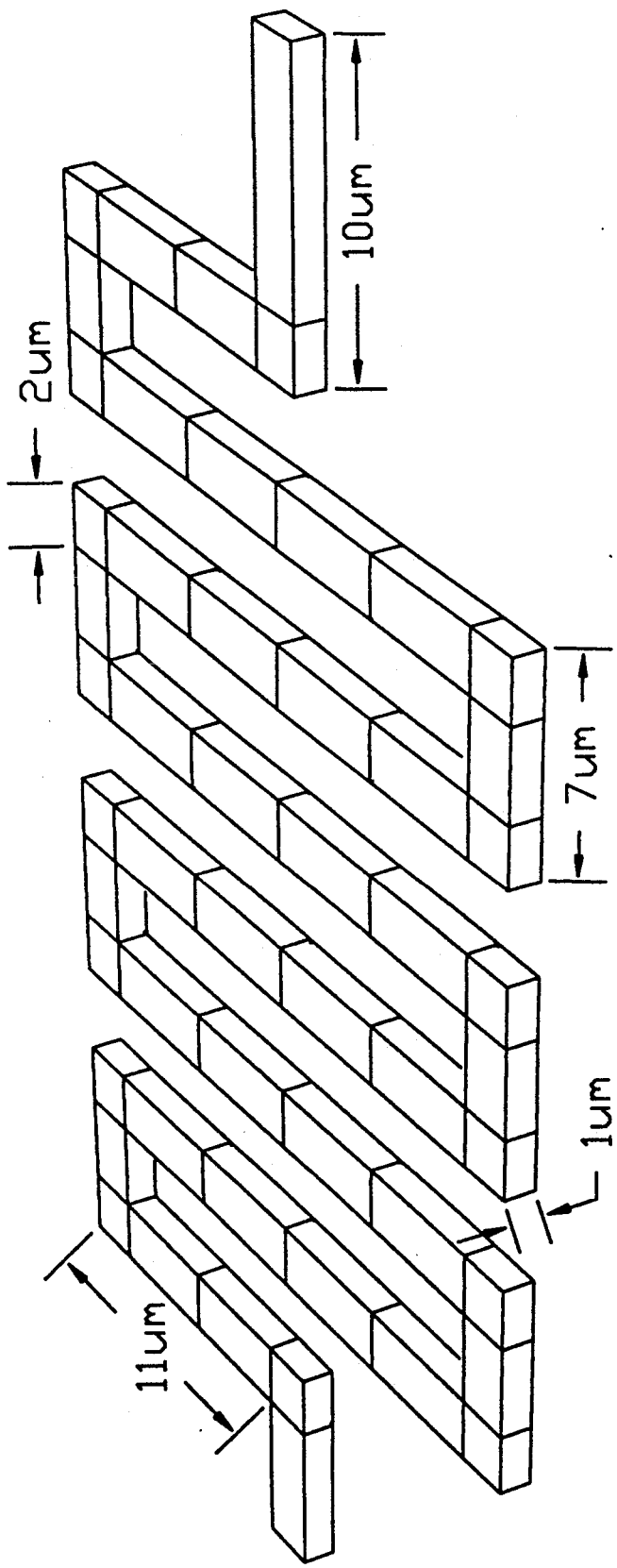
FIG._14
K-x = 11.808 uN/um
K-y = 0.656 uN/um
K-z = 0.159 uN/um
K-theta = 76.90 uN-um/deg.

LATERALLY DRIVEN RESONANT MICROSTRUCTURES

This invention was made with Goverment support under Grant Contract No. CDR-86-14900 awarded by the National Science Foundation. The Goverment has certain rights in this invention.

This invention relates to a laterally driven resonant microstructure.

BACKGROUND OF THE INVENTION

Because of the advantages of reliability, low cost, and the potential for achieving high precision microsensors, several attemps have been made to integrate mechanical tuning elements on silicon substrates. A polysilicon microbridge has been driven vertically as a resonant microsensor; it features a simple process that ensures high yield, a high quality factor-Q-in vacuum, and high tunability, by varying physical or chemical parameters.

However, vertically driven microbridges have suffered from several shortcomings. At atmospheric pressure, the Q is severely reduced by viscous damping, usually to less than 20. Furthermore, it requires holding its driving signal to a very small value to sustain resonance in a vacuum, typically on the order of a few millivolts, thereby creating a serious hurdle in designing a stable sustaining amplifier. Because the microbridge is essentially a variable capacitor driven electrostatically, the relationship between the drive signal and the capacitance readout is highly nonlinear, presenting a challenging problem for the sense circuit.

SUMMARY OF THE INVENTION

The present invention comprises a polysilicon microbridge which is driven parallel to the substrate as a resonant microstructure. One significant advantage of the lateral-drive concept is that a variety of elaborate geometric structures, such as differential capacitive excitation and detection, can be incorporated without an increase in process complexity. This flexibility enables the development of microactuators as well as microsensors based on lateral resonant structures. The performance of micromechanical resonant structures is improved by applying lateral electrostatic forces, i.e., forces parallel to the plane of the substrate. A microfabrication process of the invention uses a single polysilicon thin film that is patterned as both a stationary electrode for applying lateral electrostatic forces and as the micromechanical resonant structure, therefore, eliminating mask-to-mask misalignment for critical features.

Such electrostatic forces are used to drive lateral resonant modes of micromechanical structures. They have several advantages over the vertical resonant modes, which are perpendicular to the plane of the substrate. When operated at atmospheric pressure, lateral resonant modes have much higher quality factors (Q) than do vertical modes. In addition, the lateral drive approach enables large, linear drive voltages, larger amplitude vibrations, small electrical feedthrough, and easier excitation and detection of resonant frequencies.

Thus, interdigitated finger structures or combs can be effective for electrostatically exciting the resonance of polysilicon microstructures parallel to the plane of the substrate. Linear plates suspended by a folded-cantilever truss and torsional plates suspended by spiral and serpentine springs are fabricated from a 2 $\mu$m-thick phosphorus-doped LPCVD polysilicon film. Resonance can be observed visually, with frequencies ranging from 18 kHz to 80 KHz and quality factors from 20 to 130. Simple beam theory is adequate for calculating the resonant frequencies, using a Young's modulus of 140 GPa and neglecting residual strain in the released structures.

In such a lateral-drive approach, a mechanical structure is or can, as stated, be driven parallel to the substrate by a linear comb drive.

There are three main advantages of this new, lateral-drive structure.

(1) At atmospheric pressure, a much higher Q can be obtained than with a vertically-driven structure, because of lower damping in the lateral structure. Since the plate is suspended about 2-3 $\mu$m above the substrate, it is much easier to slide the plate parallel to the substrate than to pump air in and out from beneath the plate in vertical motion.

(2) Complicated planar geometries such as the linear comb drive can be designed without adding processing steps. The comb drive of this invention provides a linear relationship between the induced electrostatic force and the applied voltage. The operation of the comb drive is described herein.

(3) Since the structure is driven with fringing fields, convenient drive voltages on the order of volts, instead of millivolts, can be used, even in a vacuum. In vacuum without any air damping, a vertically driven bridge is usually too sensitive to applied voltage, so that the voltage must be limited to a few millivolts; such a limitation creates problems in designing a stable circuit to provide the low drive voltage.

The limitations of the vertically driven structure emphasize the advantages of the lateral-drive approach, in which the mechanical structure is driven parallel to the substrate. As the structure is designed to be driven with fringing fields, conventional drive voltages of the order of volts can be used. Also complicated geometries can be designed without adding processing steps,—a distinct advantage. This flexibility enables the use of resonant elements with high linearity, high detection sensitivity, useful oscillation amplitudes, and good isolation between the drive signal and the sense signal. The same flexibility enables resonant structures to be designed to oscillate either linearly or torsionally.

At atmospheric pressure, the Q of the lateral mode of oscillation is dominated by viscous drag in the cavity beneath the structure. Since the drag on a plate in Couette flow is far less than the viscous damping of a plate in vertical motion, a much higher Q is obtained by driving in the lateral mode. This phenomenon has been independently recognized in the development of a micro floating-element, skin friction sensor with suppressed response to pressure fluctuations.

Additional design criteria make possible more sophisticated devices. The design theory and simulation results of the more sophisticated structures feature an enhanced comb drive, stress-released beam supports, improved electrostatic shielding, and torsional plates with differential drive and sense ports.

BRIEF DESCRIPTION OF THE DRAWINGS

FIG. 1 is a plan view of a comb drive structure embodying the principles of the invention.

FIG. 2 is a plan view of a simplified comb drive structure for linearity calculation, shown in a first position.

FIG. 3 is a similar view showing the simplified comb drive structure in a second position.

FIG. 4 is a series of steps for microstructure fabrication. FIG. 4(a) shows a preforming step in which a layer of silicon nitride is deposited on top of a layer of silicon dioxide. FIG. 4(b), a first masking step with windows opened in a nitride and an oxide (silicon dioxide) layer on a silicon substrate. Further steps are shown at FIGS. 4(b), 4(c), 4(d), 4(e), 4(f), 4(g), 4(h), 4(i), and 4(j).

FIG. 5 is a plan view of a spiral-supported torsional resonant plate.

FIG. 6 is a scanning electron micrograph of a serpentine spring supporting a torsional resonant plate.

FIG. 7 is a scanning electron micrograph of a linear resonant structure.

FIG. 8 is a scanning electron micrograph of the linear comb drive structure.

FIG. 9 is a scanning electron micrograph of two two-turn Archimedean spirals supporting a torsional resonant plate.

FIG. 10 is a scanning electron micrograph of the concentric comb structure.

FIG. 11 is a graph of the predicted and measured resonant frequencies for the two types of linear resonant plates with beam lengths ranging form 80 μm to 200 μm.

FIG. 12 is a graph of measured transfer functions for two types of combs with different beam lengths.

FIG. 13 is a graph of predicted and measured quality factors for two types of combs with different beam lengths.

FIG. 14 is a perspective view of the serpentine spring support for the torsional resonant plate, indicating the dimensions and simulation results for the spring constants.

DESCRIPTION OF SOME PREFERRED EMBODIMENTS

FIG. 1 shows the layout of a linear resonant structure 20 of this invention which can be driven electrostatically from one side 21 and sensed capacitively at the other side 22 with interdigitated finger (comb) structures (23 and 24). Alternatively, the structure 20 can be driven differentially (push-pull) using the two combs 23 and 24, with the motion sensed by an impedance shift at resonance (not shown). In analyzing the electromechanical transfer function, the former, two-port configuration is considered. The motion is sensed by detecting the short-circuit current through the time-varying interdigitated capacitor 24 with a dc bias. The driving force and the output sensitivity are both proportional to the variation of the comb capacitance C with the lateral displacement x of the structure. A key feature of the electrostatic-comb drive is that $(\partial C/\partial x)$ is a constant, independent of the displacement x, so long as x is less than the finger overlap (25) (see FIG. 2). Therefore, electrostatic-comb drives can have linear electromechanical transfer functions for large displacements, in contrast to parallel-plate capacitive drives.

At the sense port 22, harmonic motion of the structure in FIG. 1 results in a sense current is which is given by $$i_s = V_S(\partial C/\partial x)(\partial x/\partial t), \qquad (1)$$

where $V_s$ is the bias voltage between the structure 20 and the stationary sense electrode 22. At the drive port 21, the static displacement x as a function of drive voltage is given by $$x = \frac{F_x}{k_{sys}} = \frac{\frac{1}{2} v_D^2 (\partial C/\partial x)}{k_{sys}}. \qquad (2)$$

where $F_x$ is the electrostatic force in the x-direction, $k_{sys}$ is the system spring constant, and $v_D$ is the drive voltage.

For a drive voltage $v_D(t) = V_P + v_d \sin(\omega t)$, the time derivative of x is $$\begin{aligned}\frac{\partial x}{\partial t} &= \frac{(\partial C/\partial x)}{2 k_{sys}} \frac{\partial (v_D^2)}{\partial t} \\ &= \frac{(\partial C/\partial x)}{2 k_{sys}} [2\omega V_P v_d \cos(\omega t) + \omega v_d^2 \sin(2\omega t)],\end{aligned} \qquad (3)$$

where the fact the $(\partial C/\partial x)$ is a constant for the interdigitated-finger capacitor 23 or 24 is used. The second-harmonic term on the right-hand-side of Eqn. (3) is negligible if $v_d << V_p$. Furthermore, if a push-pull drive is used, this term results in a common-mode force and is cancelled to first order. At mechanical resonance, the magnitude of the linear term in Eqn. (3) is multiplied by the quality factor Q, from which it follows that the magnitude of the transfer function $T(j\omega_r) = X/V_d$ relating the phasor displacement X to phasor drive voltage $V_d$ at the resonant frequency $\omega_r$ is:

$$\left| \frac{X}{V_d} \right| = V_P \frac{Q}{k_{sys}} (\partial C/\partial x). \qquad (4)$$

The transconductance of the resonant structure is defined by $G(j\omega) = I_s/V_d$. Its magnitude at resonance can be found by substitution of Eqn. (4) into the phasor form of Eqn. (1):

$$\left| \frac{I_s}{V_d} \right| = \omega V_P V_S \frac{Q}{k_{sys}} (\partial C/\partial x)^2. \qquad (5)$$

A planar electrode extends under the comb and plate in FIG. 1, which can be grounded or set to a dc potential in order to minimize parasitic capacitive coupling between the drive and sense ports. An additional function of this electrode is to suppress the excitation of undesired modes of the structure.

FIG. 1 shows the layout of a linear resonant plate with a 50 μm-long folded-beam suspension 26, 27, 28, 29 and 30. Motivations for this truss suspension are its large compliance and its capability for relief of built-in residual strain in the structural film. The folded cantilever beams 26 through 30 are anchored near a center 31, thus allowing expansion or contraction of the four beams 26, 27, 29 and 30 along the y-axis (FIG. 1). Folded beams 26a, 27a, 29a and 30a of FIG. 1 operate similarly. Both the average residual stress in the polysilicon structure 20 and stress induced by large-amplitude plate motion is largely relieved by this design. In addition, the long effective support lengths of the beams 26, 27, 29 and 30, 26a, 27a, 29a and 30a result in a highly compliant suspension. Plates with 200 μm-long trusses are resonated with amplitudes as large as 10 μm. In FIG. 1 are 815 μm-long conducting polysilicon lines 32 and 33, such that pads 21 and 22 are separated by about 2 mm to minimize the signal feed-through when one is used to sense the motion, with the other as the drive electrode.

The first order stability of the structure can be analyzed with linearized mechanical theory. In order for the plate to move in the y direction and to touch the stationary electrodes, a minimum of four beams must be buckled. A worst-case assumption using Euler's criterion for buckling a pinned-pinned beam results in:

$$F_{cr} = \frac{\pi^2 E W t^3}{12 L^2}. \tag{6}$$

Using the dimensions in FIG. 1, Eq. (6) yields a critical buckling force of 2.9 mN in the y direction. Since the structure is symmetrical along the x-axis, there is no net induced force in the y direction ($F_y$), unless the plate is moved off axis. Using the finite element method to evaluate ($\partial C/\partial y$) as a function of displacement in y, we can find the critical offset in the y direction such that $F_y$ reaches the critical buckling force. Assuming $V_{bias} = 10$ V, it is found that in order to induce a net $F_y$ of 2.9 mN, the comb fingers must be moved to within 0.1 μm from the stationary electrodes, which is very unlikely in normal operation.

An accurate analytical expression for the fundamental lateral resonant frequency, $f_r$, can be found using Rayleigh's Method:

$$f_r = \frac{1}{2\pi}\left[\frac{k_{sys}}{(M_p + 0.3714M)}\right]^{\frac{1}{2}}, \tag{7}$$

where $M_p$ and M are the masses of the plate 34 and of the supporting beams 26, 27, 29 and 30 and 26a, 27a, 29a and 30a, respectively. For the folded-beam structure, an analytical expression $k_{sys}$ can be found by assuming that the trusses 28 and 28a joining the folded beam segments are rigid:

$$k_{sys} = 24 E I / L^3 = 2 E h (W/L)^3. \tag{8}$$

where $I = (1/12) h W^3$ is the moment of inertia of the beams 26 and 26a etc. Residual strain in the structure 20 is neglected in finding this expression. Combining Eqs. (7) and (8), it follows that $$f_r = \frac{1}{2\pi}\left[\frac{2Eh(W/L)^3}{(M_p + 0.3714M)}\right]^{\frac{1}{2}}. \tag{9}$$

The quality factor Q is estimated by assuming that Couette flow underneath the plate 34 is the dominant dissipative process:

$$Q = \frac{d}{\mu A_p}(M k_{sys})^{\frac{1}{2}}, \tag{10}$$

where μ is the absolute viscosity of air ($1.8 \times 10^{-5} \mathrm{N \cdot s \cdot m^{-2}}$), and d is the offset between the plate and the substrate. Quality factors for lateral motion are much higher than for motion normal to the substrate.

FIG. 2 is an enlargement of a portion of the comb structure 23 in FIG. 1. It shows two stationary electrodes 36 and 37 and a movable finger 38. The electric field lines between the movable finger 38 and the stationary electrodes 36 and 37 are also shown. FIG. 3 shows finger 38 after a displacement of Δx into the slot between the electrodes 36 and 37. The other fingers in FIG. 1 operate similarly.

Another class of structure 40 is driven into torsional resonance by a set, four pairs, of concentric interdigitated electrodes 41 and 42. FIG. 5 shows one of the structures with two Archimedean spirals 43 and 44 as supporting beams. FIG. 6 is a scanning-electron micrograph (SEM) of another structure 45 using four serpentine springs 46, 47, 48 and 49. The structures, 40 and 45 are supported only at their centers 50, enabling some relaxation of the built-in residual stress in the polysilicon structures 40 and 45. An advantage of the torsional approach is that four or more pairs of balanced concentric comb structures can be placed at the perimeter of the ring, providing a high degree of flexibility for differential drive and sense. Since both the drive and the sense ports are differentially balanced, excitation of undesired oscillation modes is avoided and signal corruption by feedthrough is minimized. As with the lateral structure, extensive ground planes are utilized.

The torsional spring constant of the Archimedean spiral 43 or 44 is given by:

$$k_\theta = \frac{E h W^3}{12 L} \; (\mu N \cdot \mu m \cdot \mathrm{rad}^{-1}), \tag{11}$$

where L is the length of the spiral. As was done for the lateral resonant structures, residual strain in the spiral spring is neglected in the analysis. This assumption will be reexamined in the discussion of the measured resonant frequencies.

The torsional resonant frequency, $f_\theta$, is evaluated by replacing $k_{sys}$ in Eq. (7) with the torsional spring constant, $k_\theta$, and the masses, $M_p$ and M, with the mass moments of inertia, $J_p$ and J:

$$f_\theta = \frac{1}{2\pi}\left[\frac{k_\theta}{(J_p + 0.3714J)}\right]^{\frac{1}{2}}. \tag{12}$$

The value of J can be found by evaluating the following integral over an appropriate limit:

$$J = \int r^2 dM = \rho h \int \int r^3 d\theta dr, \tag{13}$$

where ρ is the density of polysilicon ($2.3 \times 10^3 \mathrm{kg \cdot m^{-3}}$).

The quality factor is estimated similarly to Eq. (10) by assuming Couette flow underneath the plate, and is given by $$Q = \frac{d(J k_\theta)^{\frac{1}{2}}}{\mu \int r^2 dA_p} \tag{14}$$

The structures 20, 40 and 45 are frequently fabricated with a four-mask process illustrated in FIG. 4. A significant advantage of this technology is that all the critical features are defined with one mask, eliminating errors due to mask-to-mask misalignment. The process begins with a standard $POCl_3$ blanket n+ diffusion, which defines the substrate ground plane after which a wafer 50 is passivated with a layer 51 of 1500 Å-thick low-pressure chemical-vapor-deposited (LPCVD) nitride deposited on top of a layer 52 of 5000 Å-thick thermal $SiO_2$ (FIG. 4(a)). Contact windows 53 to the substrate ground plane are then opened by a first mask (not shown) (FIG. 4(b)) using a combination of plasma and wet etching.

The next steps involve deposition and definition of a first polysilicon layer 54. A layer 54 of 3000 Å-thick, in situ phosphorus-doped polysilicon is deposited by LPCVD at 650° C., then patterned with a second mask (not shown) (FIGS. 4(c) and 4(d)). This layer 54 serves as a second electrode plane, the interconnection to the n+ diffusion, and for standoff bumps to prevent sticking of a second polysilicon layer 55 to the substrate 50 after the final micromachining step. A 2 μm-thick LPCVD sacrificial phosphosilicate glass (PSG) layer 56 is deposited and patterned with a third mask, (not shown), as shown in FIGS. 4(e) and 4(f), which defines the anchors 58 of the microstructures 34.

A 2 μm-thick polysilicon structural layer 55 is then deposited by LPCVD (undoped) at 605° C. (FIG. 4(g)). The structural layer 55 is doped by depositing another layer of 3000 Å-thick PSG 57 (FIG. 4(h)) and then annealing at 950° C. for one hour. This doping process is designed to dope the polysilicon layer 55 symmetrically by diffusion from the top and the bottom layers 56 and 57 of PSG. A stress-annealing step is then optionally performed at 1050° C. for 30 minutes in $N_2$. The annealing temperature is lower than 1100° C. in order to avoid loss of adhesion between the PSG layer 56 and the $Si_3N_4$ 51.

After stripping the top PSG layer 57 by a timed etch in 10:1 HF, the plates 34, their beams, and the electrostatic comb drive and sense structures 23 and 24 are defined in the final masking step (FIG. 4(i)). The structures 23, 24, etc. are anisotropically patterned in a $CCl_4$ plasma by reactive-ion etching, in order to achieve nearly vertical sidewalls. FIG. 4(j) illustrates the final cross section after the wafer 50 is immersed in 10:1 diluted HF to etch the sacrificial PSG layer 56. The movable plate, 44 and a second ground plane 35, the comb finger 36, 37, 38 and an anchor 58 for the stationary electrode 36, 37 are shown. The wafer 50 is rinsed repeatedly with deionized water for at least 30 minutes after the micromachining step is completed and is then dried in a standard spin dryer.

Surface-micromachined polysilicon structures can become stuck to the substrate after the final drying process. The yield of free-standing structures is zero on wafers for which the 30-minute stress anneal at 1050° C. is omitted. When the stress anneal is included in the process, 70% of the structures are free-standing. The 30% which are initially attached to the substrate could be freed easily with a probe (not shown); the high flexibility of the structures enables manipulation without breakage. No amount of probing, however, could free any of the unannealed structures.

FIG. 6 is a scanning electron micrograph of a serpentine spring supporting a torsional resonant plate. There is no visually observable stiction of the structure to the substrate below.

FIG. 7 is a scanning electron micrograph of a linear resonant structure with 100 μm-long supporting beams and nine fingers on each comb structure. There is no observable buckling of the beams, indicating that built in stress is largely relieved.

FIG. 8 is a scanning electron micrograph of the close-up view of the comb structure in FIG. 9, showing the details of the comb fingers.

FIG. 9 is a scanning electron micrograph of two two-turn spirals supporting a torsional plate, showing the refined details of spirals and the center anchor point 71.

FIG. 10 is a scanning electron micrograph of the close-up view of the concentric comb structure in FIG. 9.

A series of clamped-clamped microbridges (not shown) may be used to estimate the average residual strain in the polysilicon structure from the minimum buckling length. The moment of the residual strain may be qualitatively studied by a series of clamped-free cantilever beams (not shown). Since the microbridges have "step-up" anchors, it is expected that end effects should be modeled carefully to obtain an accurate value of the residual strain. Moreover, the stiction of the diagnostic microbridges and cantilevers to the substrate during drying may also be a source of error in calculating the strain and its moment.

For the unannealed samples, the resultant microcantilevers have a tendency to deflect and attach to the substrate for lengths greater than 150 μm. The buckling length of about 120 μm for microbridges may be interpreted by using the simple clamped-clamped Euler's criterion and estimate the strain as about $10^{-3}$. Annealed samples have apparently undeflected cantilevers under optical and SEM observation and have a buckling length of about 220 μm, indicating a residual strain of about $3 \times 10^{-4}$. These estimated values are typical of residual strain for phosphorus-doped polysilicon.

These lateral resonant microstructures, with all the associated benefits, such as linear lateral comb drives, stress-relief folded beams, torsional plates with concentric comb drives, and serpentine and spiral spring support arms, can be fabricated from a variety of thin films, such as metals and boron-doped crystalline silicon, using conventional surface and substrate micromachining techniques. The features can be patterned and etched from deposited films or form doped regions of the substrate.

The resonant frequencies, quality factors, and transfer function of such structures with beam lengths of 80 μm or longer can be found by visual observation under 25× magnification. Sinusoidal and dc bias voltages may be applied to the structures via probes contacting the polysilicon pads 21 and 22 in FIG. 1. For the linear structures, the sinusoidal drive voltage is applied to one set of fixed electrode fingers 36, 37, etc. via the pad 21, while a dc bias is supplied to the pad 22 (connected to the dormant sense fingers 24), and a pad 60 (connected to the first-level polysilicon ground plane and to the suspended structure). The diffused ground plane may be left floating in the initial measurements. The dormant fingers 24 are biased to eliminate electrostatic attraction between them and the resonant structure.

In order to provide large-amplitude lateral motion in air for visual observation, dc biases of up to 40 V and driving voltage amplitudes (zero to peak) of up to 10 V may be used. Resonant frequencies may be determined by maximizing the amplitude of vibration, which can be as large as 10 μm for the linear structures with the longest support beams. The measured resonant frequencies for the linear structures are listed in Table I below and those for the torsional structures are listed in Table II. The results include measurements from two different electrostatic comb structures of FIG. 14 (type A and type B), which are described with Table III.

The calculated resonant frequencies in Tables I and II (and plotted in FIG. 11) are found from Eqns. (9) and (10) above with the Young's modulus adjusted to give the best fit to the experimental data. For the serpentine-spring torsional structures of FIGS. 5 and 6, a finite-element program may be used to find the effective spring constant. The best-fit value for Young's modulus is E=140 GPa for both linear and torsional resonant structures. From Table I and II, the calculated and measured resonant frequencies are in close agreement for all the lateral structures with beam lengths ranging from 80 μm to 200 μm.

TABLE I

Predicted and Measured Resonant Frequency Values of the Linear Resonant Structures

| Beam length [μm] | Type A Predicted [kHz] | Type A Measured [kHz] | Type B Predicted [kHz] | Type B Measured [kHz] |
|---|---|---|---|---|
| 80 | 75.5 | 75.0 ± 0.05 | 71.8 | 72.3 ± 0.05 |
| 100 | 53.7 | 54.3 ± 0.05 | 51.1 | 50.8 ± 0.05 |
| 120 | 40.6 | 41.1 ± 0.1 | 38.7 | 39.4 ± 0.1 |
| 140 | 32.0 | 32.0 ± 0.2 | 30.5 | 30.0 ± 0.2 |
| 160 | 26.0 | 25.9 ± 0.2 | 24.8 | 25.0 ± 0.2 |
| 180 | 21.7 | 21.5 ± 0.3 | 20.7 | 20.3 ± 0.3 |
| 200 | 18.4 | 18.2 ± 0.3 | 17.6 | 17.5 ± 0.3 |

TABLE II

Predicted and Measured Resonant Frequency Values of the Torsional Resonant Structures

| Supporting Beam Type | Predicted [kHz] | Measured [kHz] |
|---|---|---|
| Spiral | 10.5 | 9.7 ± 0.3 |
| Serpent | 60.7 | 59.4 ± 0.2 |

TABLE III

Types A and B Features

| Features | A | B |
|---|---|---|
| # of fingers | 9 | 11 |
| Width [μm] | 4 | 4 |
| Gap [μm] | 3 | 2 |
| Fitted $\partial C/\partial x$ [aFμm$^{-1}$] | 58 | 150 |

Initial visual measurements of the quality factor Q are plotted in FIG. 13 for the linear resonant structures. The visual measurement of Q is especially difficult for structures with small vibration amplitudes, which is reflected in the larger error bars for these points. The calculated quality factors for Eqn. (10) are consistently higher than the measured values, indicating that the assumption of pure Couette flow is an oversimplification for these structures. However, the calculated values of Q are of the correct magnitude and may be useful for design. The highest measured Q is about 130 for a structure with 80 μm-long folded-beam suspension.

The magnitude of the electromechanical transfer function is measured by estimating the amplitude of vibration from the envelope of the blurred vibrating structure at a given drive voltage and bias voltage. FIG. 12 is a plot of the experimental results of the transfer functions for the linear resonant structures.

The simulation and verification of the resonant modes for these complex microstructures may be desirable. At atmospheric pressure, those modes with motion normal to the substrate are heavily damped, which greatly relaxes the design constraints on the electrostatic comb. For operation in vacuum, design of the drive structure to ensure excitation of a single mode will be challenging, due to the high intrinsic Q of polysilicon microstructures.

What is claimed is:

1. A linear, lateral-drive structure including in combination:
   a substrate,
   a stationary thin-film electrode secured to said substrate and located in a plane thereabove,
   a movable plate overlying said substrate and suspended by flexible supporting arms above said substrate,
   said movable plate and electrode being patterned to provide for each at least one comb with fingers interdigitated with those of the other.

2. The structure of claim 1 wherein the motion of said movable plate is linear.

3. The structure of claim 1 wherein the motion of said movable plate is torsional.

4. The structure of claim 1 having a set of folded beams supporting a linear resonant plate.

5. The said folded beams in claim 4 are anchored near the center of the stucture.

6. The structure of claim 1 having a spiral, anchored at the center of the structure, supporting a torsional resonant plate.

7. The structure of claim 1 having a serpentine spring, supporting a torsional resonant plate.

8. The said serpentine spring in claim 7 is anchored at the center of the structure.

9. The comb structure of claim 1 having comb fingers which are segments of concentric arcs.

10. A resonant microstructure for use as a sensor or an actuator, including in combination:
    a silicon substrate,
    a movable plate, suspended above and anchored to such substrate, and
    lateral-drive means for driving said plate electrostatically in a plane parallel to and above said substrate.

11. The microstructure of claim 10 wherein said lateral-drive means comprises a lateral comb structure for driving said plate with induced electrostatic forces.

12. A lateral-drive structure including in combination:
    a silicon substrate,
    a stationary electrode secured to and elevated above said substrate comprising a plurality of comb fingers, and
    a movable plate suspended by flexible supporting arms in the same plane as said stationary electrodes and comprising a comb with a plurality of fingers on said stationary electrodes.

13. The structure of claim 12 wherein motion of said movable plate is linear.

14. The structure of claim 12 wherein the motion of said movable plate is torsional.

15. The structure of claim 12 having a set of folded beams supporting a linear resonant plate.

16. The said folded beams in claim 15 are anchored near the center of the structure.

17. The structure of claim 15 having a spiral, anchored at the center of the structure, supporting a torsional resonant plate.

18. The structure of claim 12 having a serpentine spring, supporting a torsional resonant plate.

19. The said serpentine spring in claim 18 is anchored at the center of the structure.

20. The comb structure of claim 12 having comb fingers which are segments of concentric arcs.

* * * * *